United States Patent
Kitano

(10) Patent No.: US 10,784,923 B2
(45) Date of Patent: Sep. 22, 2020

(54) RECEIVING APPARATUS AND SIGNAL TRANSMITTING SYSTEM

(71) Applicant: YAMAHA CORPORATION, Hamamatsu-shi (JP)

(72) Inventor: Mikio Kitano, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/663,987

(22) Filed: Oct. 25, 2019

(65) Prior Publication Data
US 2020/0059262 A1 Feb. 20, 2020

Related U.S. Application Data

(63) Continuation of application No. PCT/JP2017/017061, filed on Apr. 28, 2017.

(51) Int. Cl.
*H04B 3/02* (2006.01)
*H04B 1/04* (2006.01)
(Continued)

(52) U.S. Cl.
CPC ............... *H04B 3/02* (2013.01); *H04B 1/04* (2013.01); *H04B 1/16* (2013.01); *H04B 3/50* (2013.01);
(Continued)

(58) Field of Classification Search
CPC ............... H04L 25/0272; H04L 25/028; H04L 25/0298; H04L 25/03878; H04L 25/085;
(Continued)

(56) References Cited

U.S. PATENT DOCUMENTS 6,310,408 B1 10/2001 Hermann
6,600,791 B1 7/2003 Yamauchi
(Continued)

FOREIGN PATENT DOCUMENTS

JP 2000201187 A 7/2000
JP 2001513620 A 9/2001
(Continued)

OTHER PUBLICATIONS

International Search Report dated Intl. Appln. No. PCT/JP2017/017061, dated Jul. 25, 2017. English translation provided.
(Continued)

*Primary Examiner* — Khanh C Tran
(74) *Attorney, Agent, or Firm* — Rossi, Kimms & McDowell LLP

(57) ABSTRACT

A receiving apparatus includes: a capacitance element connected to a receiving side of a transmission line through which a transmission signal is transmitted, and where a direct current flowing through the transmission line changes in accordance with a logic level of a data signal; a transistor configured to amplify a current flowing between a receiving-side node and a power supply node to which a power supply potential is supplied, where the receiving-side node is positioned between the transmission line and the capacitance element; and a data signal generator configured to generate the data signal based on the current amplified by the transistor.

9 Claims, 8 Drawing Sheets

(51) Int. Cl.
    *H04B 1/16*      (2006.01)
    *H04B 3/50*      (2006.01)
    *H04B 3/54*      (2006.01)
    *H03F 3/45*      (2006.01)
    *H04R 1/02*      (2006.01)

(52) U.S. Cl.
    CPC ........... *H04B 3/54* (2013.01); *H03F 3/45071* (2013.01); *H03F 2200/03* (2013.01); *H03F 2200/129* (2013.01); *H03F 2203/45528* (2013.01); *H04R 1/025* (2013.01); *H04R 2499/13* (2013.01)

(58) Field of Classification Search
    CPC .... H04B 3/02; H04B 3/32; H04B 2203/5491; H04B 1/04; H04B 1/16; H04B 3/30; H04B 3/50; H04B 3/54
    See application file for complete search history.

(56) References Cited

U.S. PATENT DOCUMENTS

| | | |
|---|---|---|
| 8,705,637 B2 | 4/2014 | Shibata |
| 2004/0241171 A1* | 12/2004 | Scholz ................. C12N 5/0634 424/178.1 |
| 2009/0243028 A1* | 10/2009 | Dong ................... H03K 17/689 257/499 |
| 2011/0037759 A1* | 2/2011 | Fukuda ............... H04L 25/0276 345/213 |
| 2012/0161841 A1* | 6/2012 | Dong ................... H03K 3/3565 327/206 |
| 2013/0223293 A1* | 8/2013 | Jones ....................... H04L 5/14 370/276 |
| 2019/0298152 A1* | 10/2019 | Osawa .................... A61B 1/00 |

FOREIGN PATENT DOCUMENTS

| | | |
|---|---|---|
| JP | 2002204272 A | 7/2002 |
| JP | 2010200324 A | 9/2010 |
| WO | 2012114672 A1 | 8/2012 |

OTHER PUBLICATIONS

Written Opinion issued in Intl. Appln. No. PCT/JP2017/017061, dated Jul. 25, 2017.

\* cited by examiner

RECEIVING APPARATUS AND SIGNAL TRANSMITTING SYSTEM

CROSS REFERENCE TO RELATED APPLICATIONS

This application is a Continuation Application of PCT Application No. PCT/JP2017/017061, filed Apr. 28, 2017, the entire contents of which are incorporated herein by reference.

BACKGROUND

Technical Field

This disclosure relates to a receiving apparatus and a signal transmitting system configured to receive a signal in which a data signal is multiplexed on a transmission signal.

Background Information

There is known in the art a technique of transmitting a signal such that information is multiplexed on a digital signal upon transmission via a transmission line of the digital signal from a transmitting apparatus to a receiving apparatus.

Japanese Patent Application Laid-Open Publication No. 2010-200324 discloses a method of transmitting information by changing a DC bias potential of at least one differential transmission line of a pair of differential transmission lines.

Specifically, the DC bias potential, which is obtained by dividing a voltage by resistors, is applied to one differential transmission line via a coil.

In a vehicle-mounted audio communication system, an audio signal is transmitted via a transmission line from a transmitting apparatus to a receiving apparatus. In such a system, an AC potential difference may exist between a ground of the transmitting apparatus and a ground of the receiving apparatus. If only an audio signal is transmitted via an AC coupling circuit, regardless of whether an AC potential difference exists between each of the grounds, a reduction in a SN ratio of an audio signal will not occur.

In contrast, however, in the conventional method used for a vehicle-mounted audio communication system, when an audio signal and a data signal are each transmitted via a transmission line, a DC bias potential will vary depending on an AC potential difference between each of the grounds, whereby a drawback arises in that a reduction in SN ratio of the audio signal occurs.

SUMMARY

This disclosure addresses the circumstances described above. Thus, an object of the disclosure is to reduce an unwanted influence on a transmission line caused by existence of an AC potential difference (noise voltage) between a ground of a transmitting apparatus and a ground of a receiving apparatus.

A receiving apparatus according to an aspect of this disclosure includes a capacitance element connected to a receiving side of a transmission line through which a transmission signal is transmitted, with a direct current flowing through the transmission line that changes in accordance with a logic level of a data signal; a transistor configured to amplify a current flowing between a receiving-side node and a power supply node to which a power supply potential is supplied, where the receiving-side node is located between the transmission line and the capacitance element; and a data signal generator configured to generate a data signal based on the current amplified by the transistor.

A signal transmitting system according to an aspect of the present disclosure includes a transmitting apparatus that comprises: an outputter configured to output a transmission signal to a transmission line via a transmitting-side capacitance element; and a transmitting-side transistor configured to control a direct current flowing through the transmission line in accordance with a logic level of a data signal; and a receiving apparatus that comprises: a receiving-side capacitance element connected to a receiving side of the transmission line; a receiving-side transistor configured to amplify a current flowing between a receiving-side node and a power supply node to which a power supply potential is supplied, where the receiving-side node is located between the transmission line and the receiving-side capacitance element; and a data signal generator configured to generate a data signal based on the current amplified by the receiving-side transistor.

DESCRIPTION OF THE EMBODIMENTS

Figure 1:
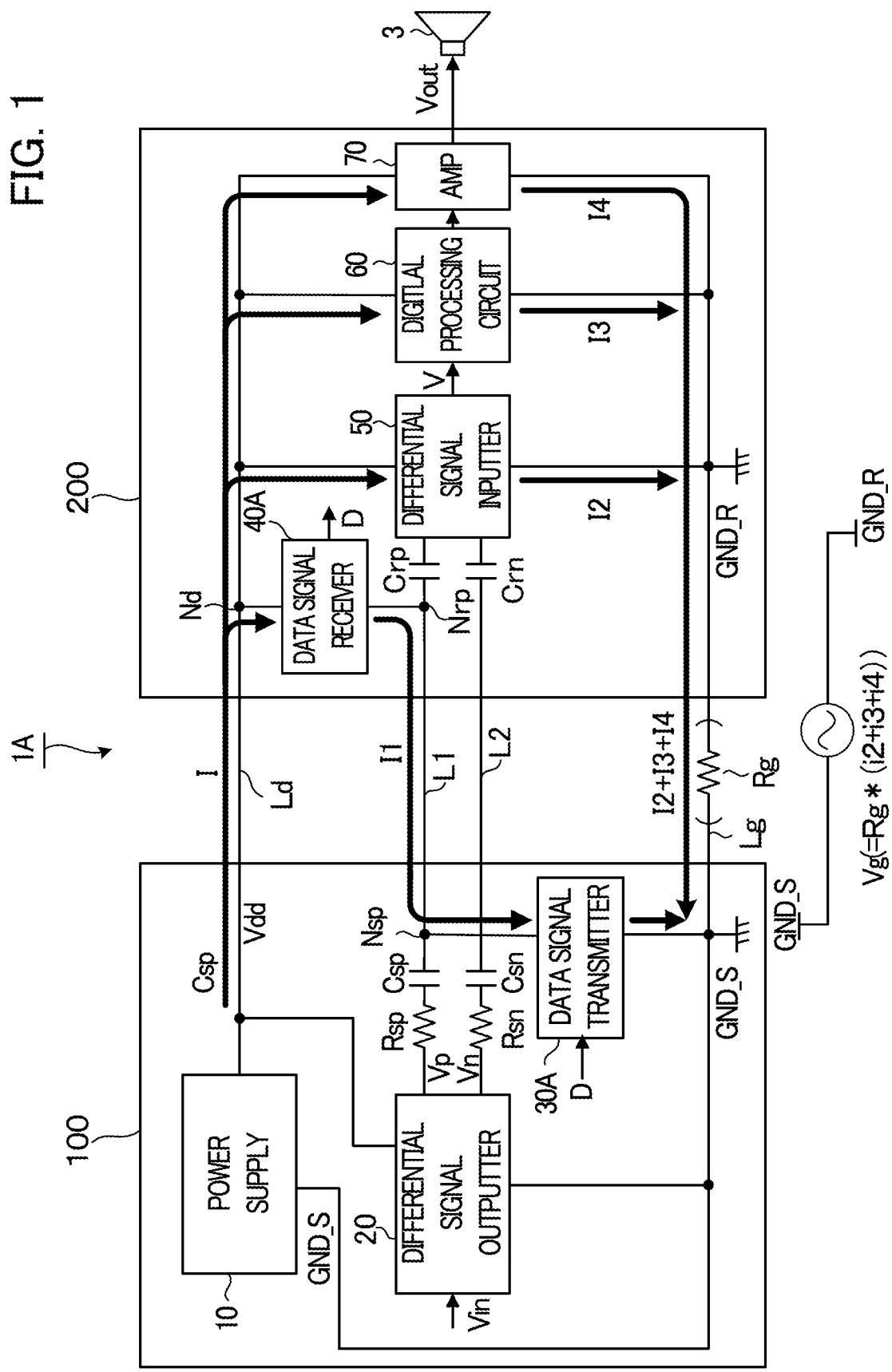
FIG. 1 is a block diagram illustrating a main electrical configuration of a signal transmitting system 1A according to a first embodiment of the present disclosure.

Embodiments according to the present disclosure will now be described with reference to the accompanying drawings. In the drawings, a dimension and scale of each part shown may differ as appropriate from those of actual parts. In the embodiments described below specific examples of the present disclosure are set out that include various preferred technical limitations. It is of note that the scope of the present disclosure is not limited to the examples set out unless otherwise specified in the description of the present disclosure.

1. First Embodiment

FIG. 1 is a block diagram illustrating a main electrical configuration of a signal transmitting system 1A according to a first embodiment of the present disclosure.

The signal transmitting system 1A includes a transmitting apparatus 100, a receiving apparatus 200, a first transmission line L1, and a second transmission line L2.

The transmitting apparatus 100 includes a power supply 10, a differential signal outputter 20, and a data signal transmitter 30A. The power supply 10 outputs a power supply potential Vdd and a transmitting-side ground potential GND_S. Based on an input audio signal Vin, the differential signal outputter 20 generates a positive-phase signal Vp and an inverted-phase signal Vn obtained by inverting the positive-phase signal Vp. The differential signal outputter 20 is a differential signal output circuit, for example. The positive-phase signal Vp and the inverted-phase signal Vn are AC signals. The positive-phase signal Vp is output to the first transmission line L1 via a resistance element Rsp and a first transmitting-side capacitance element Csp. The inverted-phase signal Vn is output to the second transmission line L2 via a resistance element Rsn and a second transmitting-side capacitance element Csn. The input audio signal Vin is transmitted as a differential voltage via each of the first transmission line L1 and the second transmission line L2, which are balanced.

The data signal transmitter 30A is connected to a first transmitting-side node Nsp located between the first transmission line L1 and the first transmitting-side capacitance element Csp. In accordance with a logic level of a data signal D, the data signal transmitter 30A controls a direct current flowing from the receiving apparatus 200 to the transmitting apparatus 100 via the first transmission line L1. That is, the data signal D is transmitted as a direct current.

The receiving apparatus 200 includes a data signal receiver 40A, a differential signal inputter 50, a digital signal processing circuit 60, and an amplifier 70. The differential signal inputter 50 receives the positive-phase signal Vp through a first receiving-side capacitance element Crp (a first capacitance element). The differential signal inputter 50 receives the inverted-phase signal Vn through a second receiving-side capacitance element Crn (a second capacitance element). Based on the positive-phase signal Vp and the inverted-phase signal Vn, the differential signal inputter 50 generates a single-ended audio signal V, which is an analog signal. The differential signal inputter 50 is a differential signal input circuit, for example. The digital processing circuit 60 includes, for example, a Digital Signal Processor (DSP). The digital processing circuit 60 converts the audio signal V into a digital audio signal. The digital processing circuit 60 performs various digital processes on the digital audio signal to generate a digital processed signal. The digital processing circuit 60 converts the digital processed signal into an analog output signal. The digital processing circuit 60 outputs the analog output signal to the amplifier 70. The amplifier 70 generates an output audio signal Vout by amplifying the analog output signal. The amplifier 70 outputs the output audio signal Vout to a speaker 3.

The power supply potential Vdd is supplied to a power supply node Nd. A first receiving-side node Nrp (a receiving-side node) is located between the first transmission line L1 and the first receiving-side capacitance element Crp. The data signal receiver 40A generates the data signal D based on a direct current flowing between the power supply node Nd and the first receiving-side node Nrp.

By use of such a configuration, a current I flows from the transmitting apparatus 100 to the receiving apparatus 200 in a power supply line Ld. A current I1 flows from the receiving apparatus 200 to the transmitting apparatus 100 via a route from the data signal receiver 40A to the data signal transmitter 30A via the first transmission line L1. A current I2 flows through the differential signal inputter 50. A current I3 flows through the digital signal processing circuit 60. A current I4 flows through the amplifier 70. The currents I3 and I4 are added to the current I2. The total current of the currents I2, I3 and I4 flows through a ground line Lg. The current I1 is a direct current. Each of the currents I2 and I4 is obtained by multiplexing an alternating current on a direct current. However, in a situation in which the positive-phase signal Vp is not transmitted through the first transmission line L1 and in which the inverted-phase signal Vn is not transmitted through the second transmission line L2, each of the currents I2 and I4 is a direct current. The current I3 is an alternating current multiplexed on a direct current irrespective of transmission of the positive-phase signal Vp and the inverted-phase signal Vn.

In the signal transmitting system 1A according to the first embodiment, the currents I2, I3 and I4 flow through the equivalent resistance Rg of the ground line Lg. Here, where AC components of the currents I2, I3 and I4 are assumed to be i2, i3 and i4, an AC potential difference Vg between a receiving-side ground potential GND_R and a transmitting-side ground potential GND_S becomes Rgr*(i2+i3+i4). Rgr is the resistance value of the resistance Rg. The AC potential difference Vg becomes a noise voltage. In the signal transmitting system 1A illustrated in FIG. 1, the transmitting apparatus 100 is connected to the receiving apparatus 200 via the ground line Lg. When the signal transmitting system 1A is used in a vehicle-mounted audio communication system, the ground of the transmitting apparatus 100 may be connected to a frame of a vehicle, and the ground of the receiving apparatus 200 may also be connected to the frame of the vehicle. In this case, currents flowing through the equivalent resistor Rg are not limited to the currents I2, I3 and I4. For example, the currents flowing through the equivalent resistor Rg may include a current from another device in addition to the currents I2, I3 and I4. Such a current is reflected in the AC potential difference Vg. The current flowing from another device is, for example, an ignition noise current.

Here, the AC potential difference Vg acts as in-phase noise with respect to the positive-phase signal Vp and the inverted-phase signal Vn. In differential transmission, if the transmission characteristics of the first transmission line L1 and the transmission characteristics of the second transmission line L2 are balanced with each other, a common-mode rejection ratio (CMRR) is high. Therefore, if the data signal transmitter 30A and the data signal receiver 40A are not connected to the first transmission line L1, an impact of the AC potential difference Vg on the SN ratio of the audio signal V is insignificant.

However, in the present embodiment, the data signal transmitter 30A and the data signal receiver 40A are connected to the first transmission line L1 for transmission of the data signal D via the first transmission line L1. Therefore, the transmission characteristics of the first transmission line L1 and the transmission characteristics of the second transmission line L2 are not balanced with each other. A further drawback occurs in that the AC potential difference Vg enters as noise into the first transmission line L1 through the data signal transmitter 30A. As will be described in detail later, in the present embodiment, the data signal receiver 40A includes a transistor. The transistor amplifies the current between the power supply node Nd and the first receiving-side node Nrp. Accordingly an impact on the first transmission line L1 can be reduced.

Figure 2:
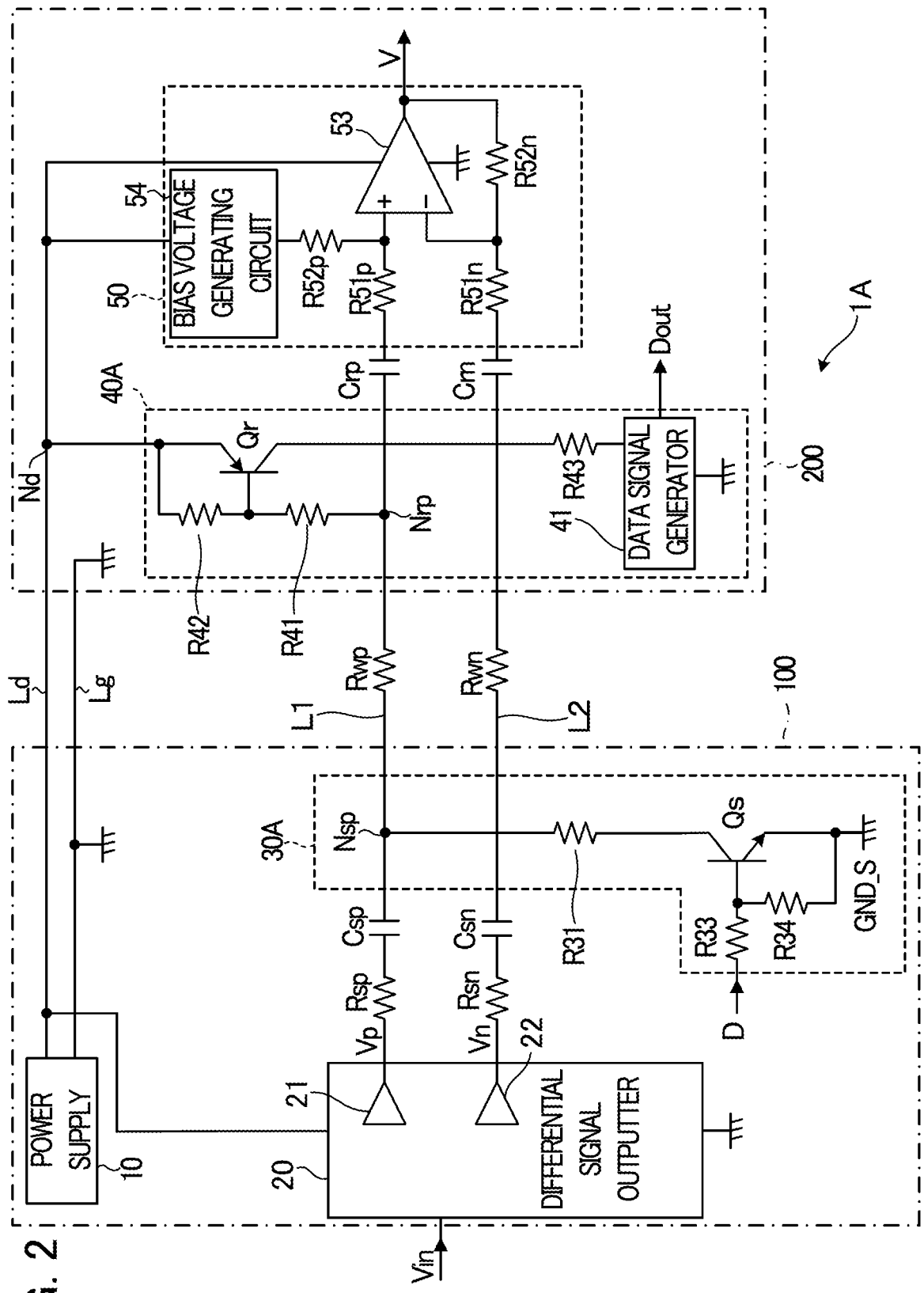
FIG. 2 is a circuit diagram of a signal transmitting system 1A according to the same embodiment.

FIG. 2 illustrates a circuit diagram of a signal transmitting system 1A. In FIG. 2, "Rwp" denotes an equivalent resistance of the first transmission line L1. In FIG. 2, "Rwn" denotes the equivalent resistance of the second transmission line L2. In FIG. 2, the digital processing circuit 60 and the amplifier 70 are each omitted.

In the transmitting apparatus 100, the differential signal outputter 20 includes a buffer 21 and a buffer 22. The buffer 21 acts as an outputter that outputs the positive-phase signal Vp, while the buffer 22 acts as an outputter that outputs the inverted-phase signal Vn. Since the driving capacities of the buffer 21 and the buffer 22 are limited, it is preferable that a load on the buffer 21 and a load on the buffer 22 are large.

The data signal transmitter 30A includes resistance elements R31, R33, and R34, and a transmitting-side transistor Qs. The resistance element R31 is provided between the first transmitting-side node Nsp and the collector of the transmitting-side transistor Qs. The transmitting-side transistor Qs is of the NPN type. One terminal of the resistance element R33 is connected to the base of the transmitting-side transistor Qs, and the other terminal thereof is supplied with the data signal D. The resistance element R34 is provided between the base and emitter of the transmitting-side transistor Qs. The transmitting-side transistor Qs is turned on when the logic level of the data signal D is high, and is turned off when the logic level of the data signal D is low. When the transmitting-side transistor Qs is turned on, the potential of the first transmission line L1 is pulled down to the transmitting-side ground potential GND_S via the resistance element R31. Regardless of the state of the transmitting-side transistor Qs, the potential of the first transmission line L1 is pulled up to the power supply potential Vdd via a resistance element R41 (a first resistance element) and a resistance element R42 (a second resistance element).

In the receiving apparatus 200, the data signal receiver 40A includes the resistance element R41 and the resistance element R42. The resistance element R41 is provided between the first receiving-side node Nrp (a receiving-side node) and the base of a receiving-side transistor Qr. The resistance element R42 is provided between the base of the receiving-side transistor Qr and the power supply node Nd to which the power supply potential Vdd is supplied. The potential of the collector of the transmitting-side transistor Qs becomes the transmitting-side ground potential GND_R when the data signal D is high, and becomes the power supply potential Vdd when the logic level of the data signal D is low. Therefore, the receiving-side transistor Qr is turned on when the logic level of the data signal D is high, and the receiving-side transistor Qr is turned off when the logic level of the data signal D is low.

The emitter of the receiving-side transistor Qr is connected to the power supply node Nd. The collector of the receiving-side transistor Qr is connected to a data signal generator 41 via a resistance element R43. The data signal generator 41 generates the data signal D based on the current flowing through the receiving-side transistor Qr. More specifically, the data signal generator 41 includes a current detector. When the receiving-side transistor Qr is turned on, a current flows between the emitter and the collector of the receiving-side transistor Qr. In this case, the current detector generates the data signal D a logic level of which is high. On the other hand, when the receiving-side transistor Qr is turned off, no current flows between the emitter and the collector of the receiving-side transistor Qr. In this case, the current detector generates the data signal D a logic level of which is low. The collector voltage of the receiving-side transistor Qr may be used as the data signal D.

The positive-phase signal Vp is input to the differential signal inputter 50 through the first receiving-side capacitance element Crp. The inverted-phase signal Vn is input to the differential signal inputter 50 through the second receiving-side capacitance element Crn. The differential signal inputter 50 includes resistance elements R51p, R52p, R51n and R52n, an operational amplifier 53, and a bias voltage generating circuit 54. The bias voltage generating circuit 54 divides the power supply potential Vdd to output an intermediate potential (Vdd−GND_R)/2 at a low impedance.

One terminal of the resistance element R51p is connected to the first receiving-side capacitance element Crp, and the other terminal of the resistance element R51p is connected to the positive input terminal of the operational amplifier 53. One terminal of the resistance element R52p is connected to the positive input terminal of the operational amplifier 53. The intermediate potential is supplied from the bias voltage generating circuit 54 to the other terminal of the resistance element R52p. One terminal of the resistance element 51n is connected to the second receiving-side capacitance element Crn, and the other terminal of the resistance element 51n is connected to the negative input terminal of the operational amplifier 53. One terminal of the resistance element R52n is connected to the negative input terminal of the operational amplifier 53, and the other terminal of the resistance element R52n is connected to the output terminal of the operational amplifier 53. When the resistance values of the resistance elements R51p, R52p, R51n and R52n are equal to each other, the audio signal V output from the operational amplifier 53 is indicated as follows: V=Vp−Vn.

Figure 3:
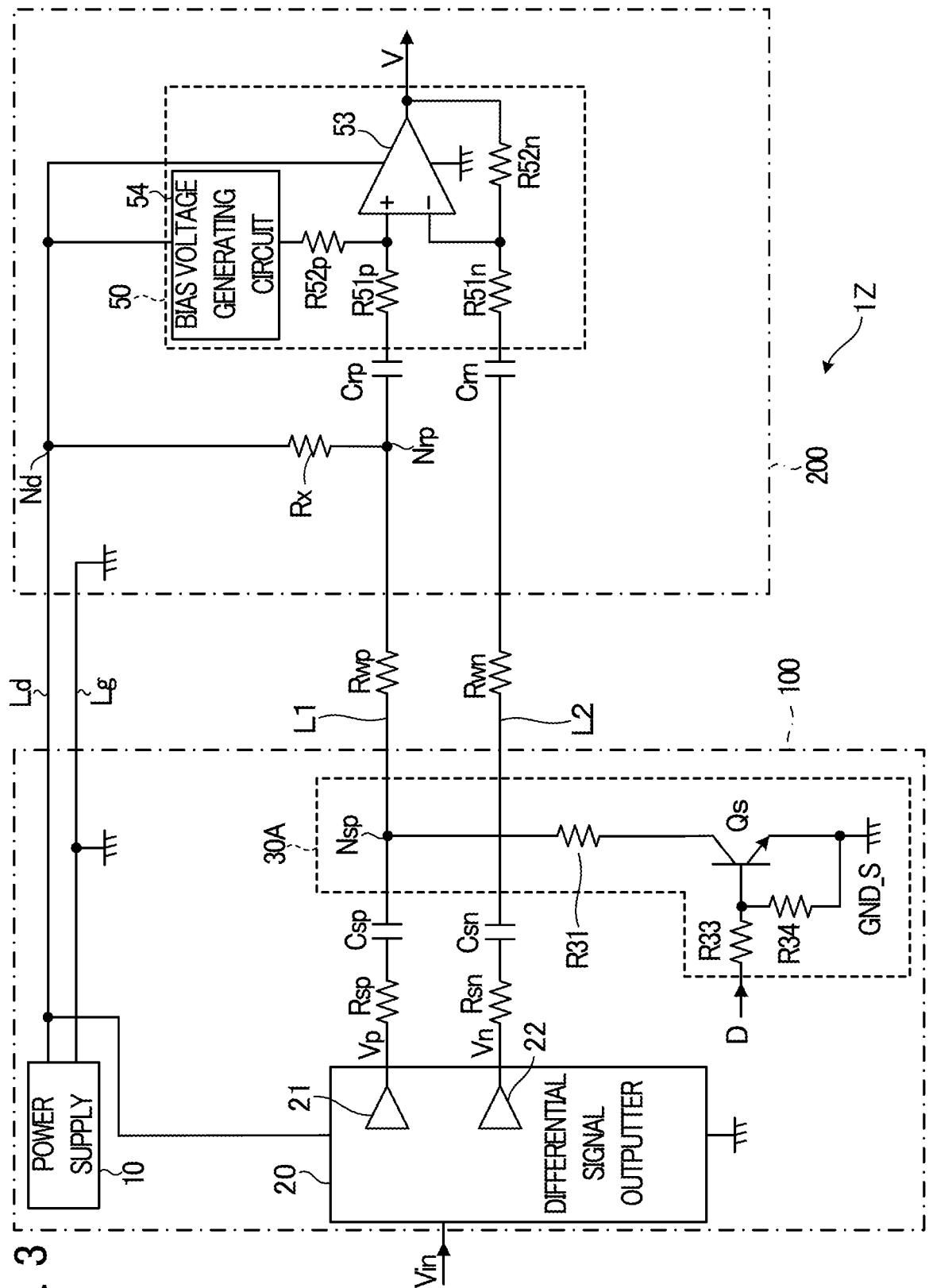
FIG. 3 is a circuit diagram of a signal transmitting system 1Z according to a comparative example.

The CMRR in the signal transmitting system 1A will now be described with reference to a comparative example. A signal transmitting system 1Z of the comparative example illustrated in FIG. 3 is configured in the same manner as the signal transmitting system 1A illustrated in FIG. 2 with the exception that a resistance element Rx is provided in place of the data signal receiver 40A. One terminal of the resistance element Rx is connected to the power supply node Nd, and the other terminal of the resistance element Rx is connected to the first receiving-side node Nrp. The signal transmitting system 1Z detects a magnitude of a current flowing through the resistance element Rx in the receiving apparatus 200 to generate the data signal D. In FIG. 3, the digital processing circuit 60 and the amplifier 70 are each omitted.

In the signal transmitting system 1Z of the comparative example, when the transmitting-side transistor Qs is turned on, it is preferable that a current of about 1 mA or more flows through the resistance element Rx to determine the logic level of the data signal D. Here, a current of about 1 mA can be supplied to the resistance element Rx when the power supply potential Vdd is 5 V, the resistance value of the resistance element Rx is 2.4 k ohms, and the resistance value of the resistance element R31 is 2.4 k ohms. The value of the equivalent resistance Rwp of the first transmission line L1 is about 0.3 ohms, and the resistance value of the resistance element Rsp is 47 ohms.

By use of such a configuration, a load where the first transmission line L1 is viewed from the buffer 21 is mainly determined by a resistance value of a combined resistance in which the resistance element R31 and the resistance element Rx are connected in parallel. To increase the load, the resistance values of the resistance element R31 and the resistance element Rx may be increased. However, to transmit the data signal D by an electrical current, it is necessary for a current of about 1 mA to flow through the resistance element Rx and the resistance element R31. Accordingly, it is not possible to increase the resistance values of the resistance element R31 and the resistance element Rx.

On the other hand, in the signal transmitting system 1A according to the first embodiment, the resistance value of the resistance element R42 is 10 k ohms. The resistance value of the resistance element R41 is 10 k ohms, and the resistance value of the resistance element R31 is 13.3 k ohms. When the transmitting-side transistor Qs is turned on, the base potential of the receiving-side transistor Qr becomes 4.3 V (=5 V-0.7 V). Therefore, the value of the current flowing through the first transmission line L1 becomes approximately 0.18 mA (=4.3 V/23.3 k ohms).

The current value of the current flowing through the first transmission line L1 in the first embodiment becomes smaller than the current value of the current flowing through the first transmission line L1 in the comparative example. However, the receiving-side transistor Qr in the first embodiment amplifies the current flowing between the power supply node Nd and the first receiving-side node Nrp. Therefore, when the transmitting-side transistor Qs and the receiving-side transistor Qr are in the ON state, a current of approximately 1 mA can be supplied to the data signal generator 41, while the current flowing through the first transmission line L1 is approximately 0.18 mA. Accordingly, a load on the buffer 21 can be increased while generating the data signal D.

In the comparative example, a high-pass filter is constituted by the first transmitting-side capacitor Csp, the resistance element R31 and the resistance element Rx, while in the first embodiment a high-pass filter is constituted by the first transmitting-side capacitance element Csp, the resistance element R31 and the resistance element R41. In contrast with the comparative example, in the first embodiment the resistance value of the resistance element R31 and the resistance element R41 can be increased. Therefore, the cutoff frequency of the high-pass filter is lowered. As a result, in contrast with the comparative example, in the first embodiment attenuation of the positive-phase signal Vp can be reduced in the low frequency band.

As described with reference to FIG. 1, the AC potential difference Vg is multiplexed at the transmitting-side ground potential GND_S of the receiving apparatus 200. In the first embodiment, the current flowing between the power supply node Nd and the first receiving-side node Nrp is amplified by the receiving-side transistor Qr. Accordingly, in contrast with the comparative example, in the first embodiment the resistance values of the resistance elements R31 and R41 can be increased. Thus, the AC potential difference Vg entering the first transmission line L1 can be made small, and the CMRR can therefore be made larger.

Figure 4:
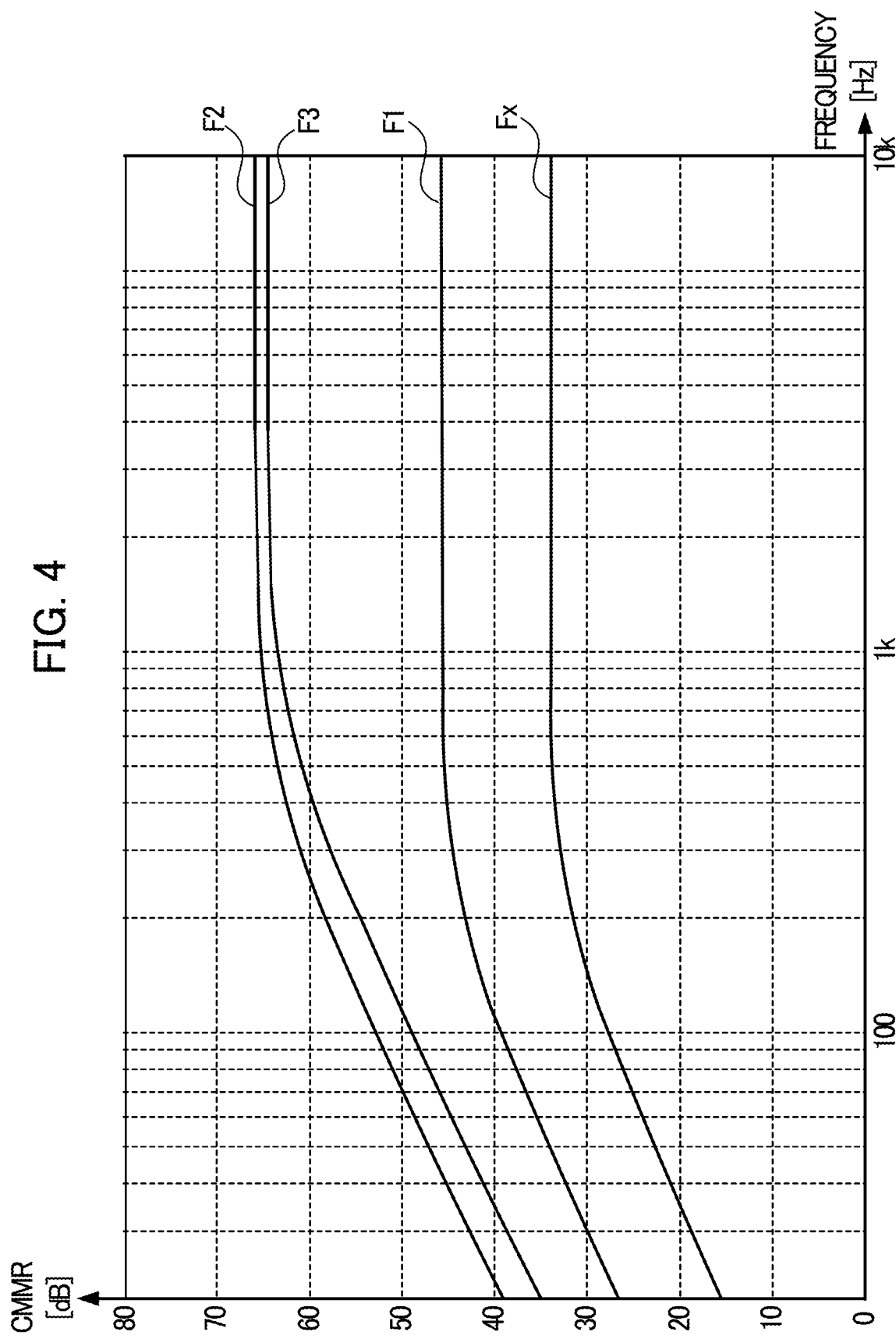
FIG. 4 is a graph illustrating the results of a simulation of CMRR.

FIG. 4 shows the results of the simulation of the CMRR. In contrast with the frequency characteristic Fx of the CMRR in the comparative example, the frequency characteristic F1 of the CMRR in the first embodiment is improved by approximately 12 dB. In the signal transmitting system 1A, the resistance value of the resistance element R41 is 10 k ohms, and the resistance value of the resistance element R31 is 13.3 k ohms. On the other hand, in the signal transmitting system 1Z, the resistance value of the resistance element Rx is 2.4 k ohms, and the resistance value of the resistance element R31 is 2.4 k ohms. This is because the resistance value of the signal transmitting system 1A is approximately 4 times (12 dB) larger than that of the signal transmitting system 1Z.

2. Second Embodiment

A signal transmitting system 1B according to a second embodiment differs from the signal transmitting system 1A according to the first embodiment in that the data signal D is transmitted by use not only of the first transmission line L1 but also by use of the second transmission line L2.

Figure 5:
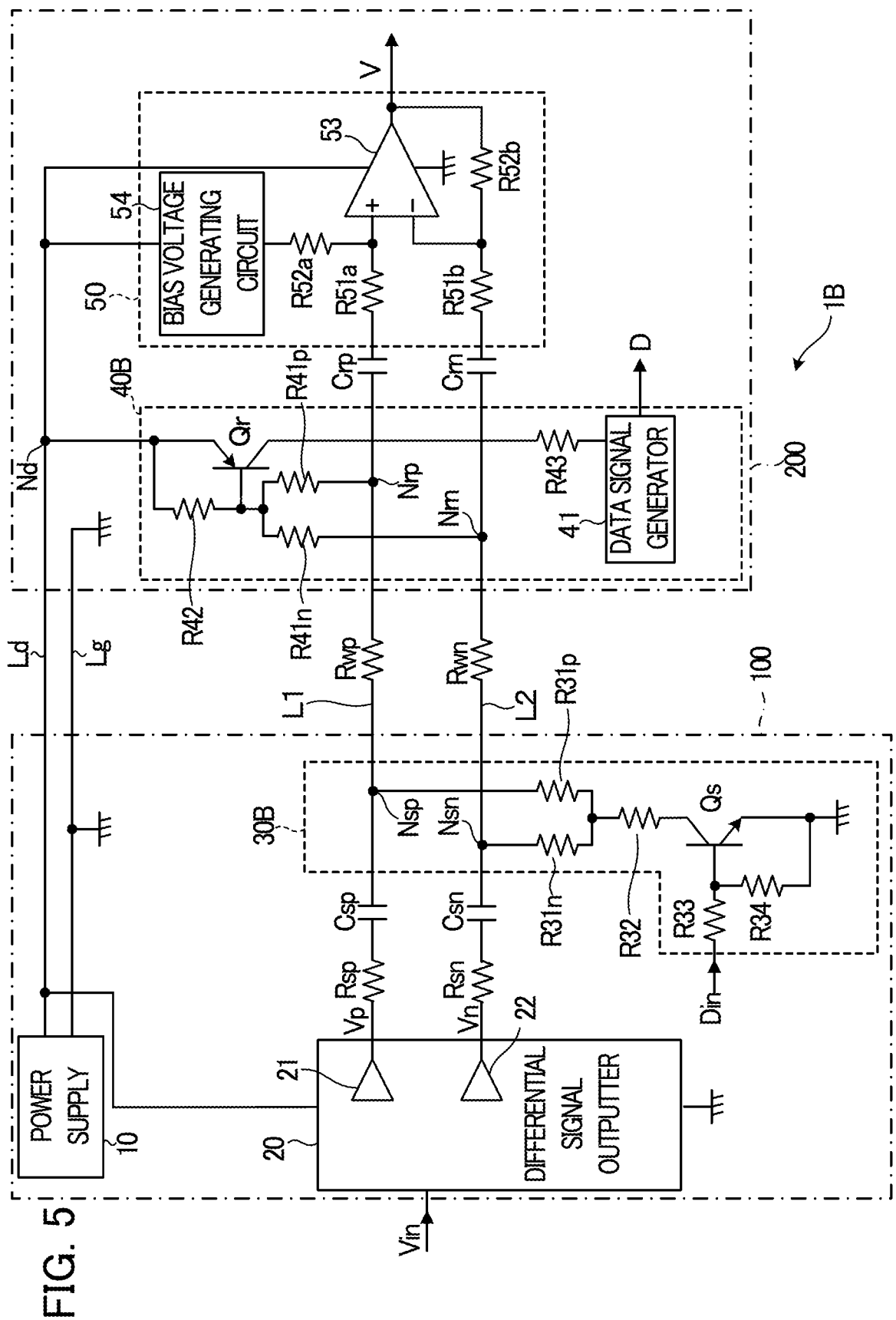
FIG. 5 is a circuit diagram illustrating a configuration of a signal transmitting system 1B according to a second embodiment.

FIG. 5 shows a circuit diagram of the signal transmitting system 1B according to the second embodiment. The signal transmitting system 1B is similar to the signal transmitting system 1A according to the first embodiment, with the exceptions that a data signal transmitter 30B is used instead of the data signal transmitter 30A, and a data signal receiver 40B is used instead of the data signal receiver 40A. In FIG. 5, the digital processing circuit 60 and the amplifier 70 are omitted.

The data signal transmitter 30B is connected to the first transmitting-side node Nsp and a second transmitting-side node Nsn. In accordance with the logic level of the data signal D, the data signal transmitter 30B controls the direct currents flowing from the receiving apparatus 200 to the transmitting apparatus 100 via the first transmission line L1 and via the second transmission line L2.

The data signal transmitter 30B includes resistance elements R31$p$, R31$n$, R32, R33, and R34, and the transmitting-side transistor Qs. One terminal of the resistance element R31$p$ (a first transmitting-side resistance element) is connected to the first transmitting-side node Nsp, and the other terminal of the resistance element R31$p$ is connected to one terminal of the resistance element R32. One terminal of the resistance element R31$n$ (a second transmitting-side resistance element) is connected to the second transmitting-side node Nsn, and the other terminal of the resistance element R31$n$ is connected to the one terminal of the resistance element R32 which is connected to the resistance element R31$p$. The other terminal of the resistance element R32 is connected to the collector of the transmitting-side transistor Qs. The connection relationship between the resistance element R33, the resistance element R34 and the transmitting-side transistor Qs is the same as that of the data signal transmitter 30A. It is of note that the resistance element R32 may be omitted, and the resistance element R31$p$ and the resistance element R31$n$ may be connected to the collector of the transmitting-side transistor Qs. In this case, the resistance value of the resistance element R32 may be assigned to the resistance value of the resistance element R31$p$ and the resistance value of the resistance element R31$n$.

When the logic level of the data signal D becomes high, the transmitting-side transistor Qs is turned on. In this case, the potential of the first transmission line L1 is pulled down to the transmitting-side ground potential GND_S by the resistance element R31$p$ and the resistance element R32. When the transmitting-side transistor Qs is turned on, the potential of the second transmission line L2 is pulled down to the transmitting-side ground potential GND_S by the resistance element R31$n$ and the resistance element R32. On the other hand, when the transmitting-side transistor Qs is turned off, the potential of the first transmission line L 1 is pulled up to the power supply potential Vdd by a resistance element R41$p$ and the resistance element R42. Similarly, when the transmitting-side transistor Qs is turned off, the potential of the second transmission line L2 is pulled up to the power supply potential Vdd by a resistance element R41$n$ (a third resistance element) and the resistance element R42 (a second resistance element and second receiving-side resistance element).

The data signal receiver 40B is configured in the same manner as the data signal receiver 40A with the exceptions that the resistance element R41$n$ (a third receiving-side resistance element) is provided between a second receiving-side node Nrn and the base of the receiving-side transistor Qr, and the resistance element R41p (a first receiving side resistance element) is used instead of the resistance element R41.

In a second embodiment, the data signal D is transmitted by use not only the first transmission line L1 but also by the second transmission line L2. Thus, the characteristics of the resistance elements connected to the first transmission line L1 can be made the same as those of the resistance elements connected to the second transmission line L2. As a result, the transmission characteristic of the first transmission line L1 and the transmission characteristic of the second transmission line L2 can be made close to each other. Consequently, the CMRR can be greatly improved.

In the data signal receiver 40B in the second embodiment, the resistance element R41p (a first resistance element) is connected to the first transmission line L1. The resistance element R41n (a third resistance element) is connected to the second transmission line L2. The resistance elements R41p and R41n are connected to the base of the receiving-side transistor Qr. Consequently, it is not necessary to provide the transistor in each of the first transmission line L1 and the second transmission line L2. When a transistor is provided in each of the first transmission line L1 and the second transmission line L2, the voltage Vbe between the base and emitter of each transistor may differ from each other due to the difference between the transistors. In the second embodiment, the one receiving-side transistors Qr amplify the current flowing between the power supply node Nd and the first receiving-side node Nrp, and the one receiving-side transistors Qr amplify a current flowing between the power supply node Nd and the second receiving-side node Nm. As a result, the configuration can be simplified and the CMRR can be improved.

In the first embodiment, the resistance value of the resistance element R31 is 13.3 k ohms. On the other hand, in the second embodiment, the resistance values of the resistance element R31p and the resistance element R31n can be set to 20 k ohms, and the resistance value of the resistance element R32 can be set to 3.3 k ohms, respectively. In the first embodiment, the resistance value of the resistance element R41 is 10 k ohms. On the other hand, in the second embodiment, the resistance values of the resistance element R41p and the resistance element R41n can each be set to 20 k ohms.

In the first embodiment, the data signal D is transmitted by use of the first transmission line L1 only, and as a result a difference between the transmission characteristic of the first transmission line L1 and the transmission characteristic of the second transmission line L2 increases. In contrast, in the second embodiment, the data signal D is transmitted using both the first transmission line L1 and the second transmission line L2, and as a result the transmission characteristic of the first transmission line L1 and the transmission characteristic of the second transmission line L2 can be balanced. Thus, use of the signal transmitting system 1B according to the second embodiment improves the CMRR across the entire frequency band, in contrast to the signal transmitting system 1A according to the first embodiment.

In the first embodiment, the data signal D is transmitted by use of the first transmission line L1. When the data signal D is transmitted by use of either the first transmission line L1 or the second transmission line L2, a direct current corresponding to the logic level of the data signal D is modulated by the input audio signal Vin. Therefore, when the data signal D is accurately generated in the receiving apparatus 200, it is necessary to perform the smoothing processing in the data signal generator 41. In contrast, in the signal transmitting system 1B according to the second embodiment, the sum of the current value of the current flowing through the resistance element R41n and the current value of the current flowing through the resistance element R41p remains constant regardless of the input audio signal Vin, thus obviating a need to perform smoothing processing.

As described with reference to FIG. 1, the AC potential difference Vg is multiplexed on the transmitting-side ground potential GND_S of the receiving apparatus 200. In the second embodiment, since the resistance value of the resistance element is increased as described above, the AC potential difference Vg entering the first transmission line L1 and the second transmission line L2 can be reduced, as compared with the first embodiment. Moreover, since the AC potential difference Vg entering the first transmission line L1 and the second transmission line L2 is in-phase noise, the in-phase noise can be effectively removed at the high CMRR.

As illustrated in FIG. 4, in comparison with the frequency characteristic F1 of the CMRR according to the first embodiment, the frequency characteristic F2 of the CMRR according to the second embodiment is improved by about 13 dB in a low band of 200 Hz or lower, and is improved by about 20 dB in a high band of 1 kHz or higher.

3. Third Embodiment

In the signal transmitting system 1B according to the second embodiment, one data signal D is transmitted by use of each of the first transmission line L1 and the second transmission line L2. In contrast, the signal transmitting system 1C according to the third embodiment transmits a first data signal D1 by use of the first transmission line L1, and transmits a second data signal D2 by use of the second transmission line L2. Accordingly, the signal transmitting system 1C according to the third embodiment can double the data transmission amount compared with the data transmission amount in the signal transmitting system 1A according the first embodiment and the signal transmitting system 1B according to the second embodiment.

Figure 6:
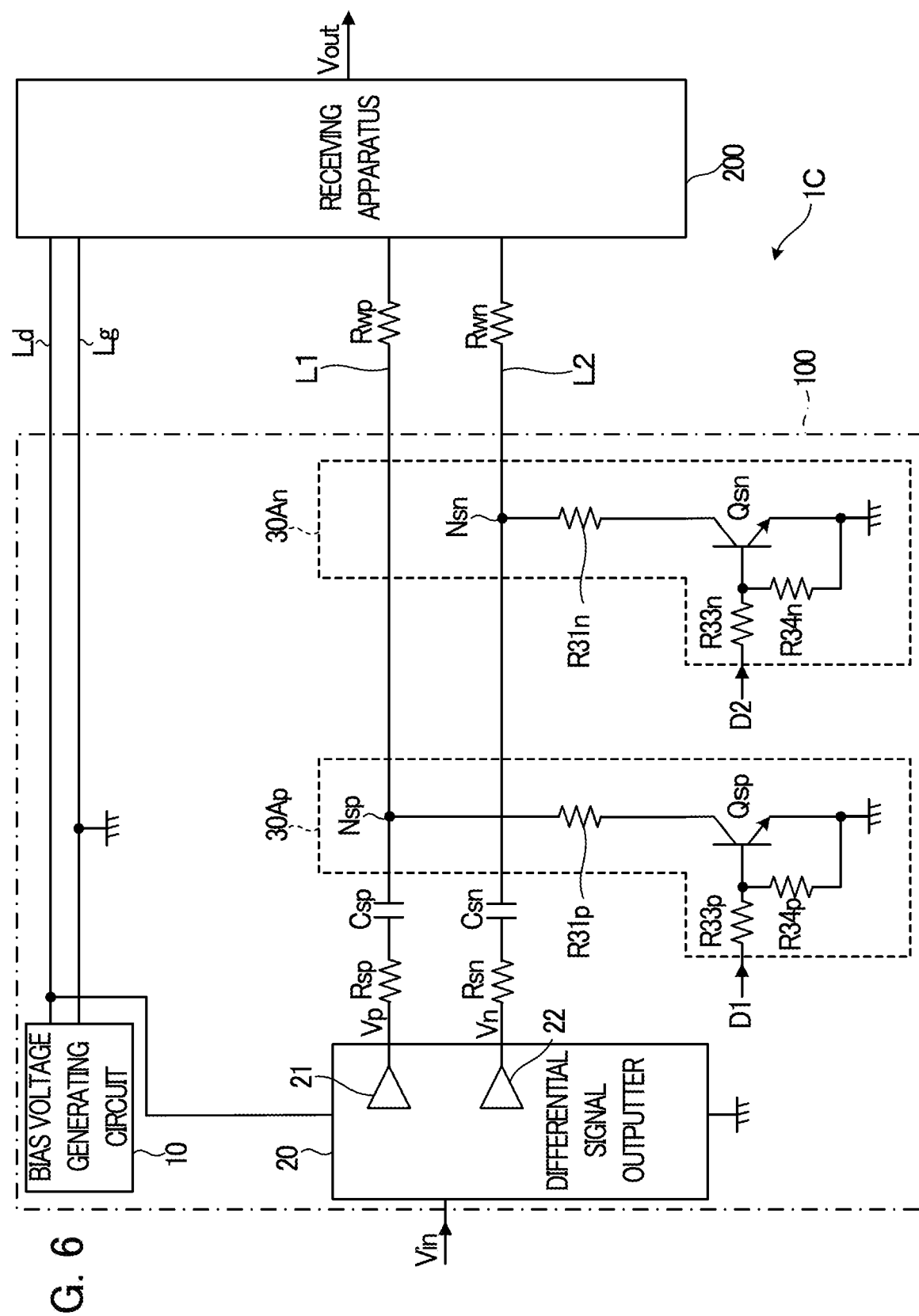
FIG. 6 is a circuit diagram illustrating a configuration of a signal transmitting system 1C according to a third embodiment.
Figure 7:
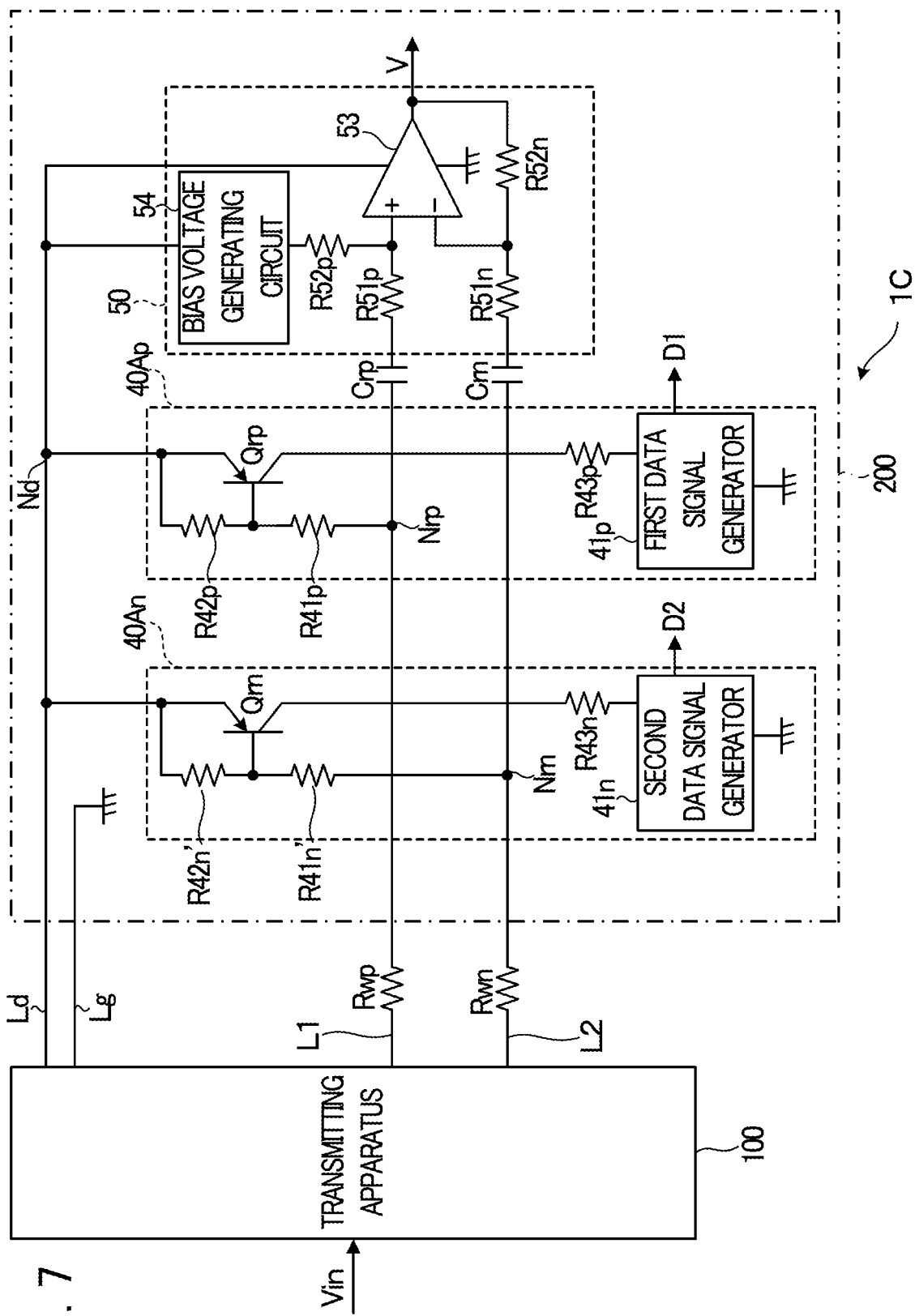
FIG. 7 is a circuit diagram illustrating a configuration of a signal transmitting system 1C according to the same embodiment.

FIGS. 6 and 7 show a circuit diagram of a signal transmitting system 1C according to the third embodiment. In FIG. 6, a first data signal transmitter 30Ap and a second data signal transmitter 30An are configured in the same manner as the data signal transmitter 30A according to the first embodiment.

A subscript "p" is appended to the code of each element constituting the first data signal transmitter 30Ap, and a subscript "n" is appended to the code of each element constituting the second data signal transmitter 30An. As a result, each element constituting the first data signal transmitter 30Ap can be distinguished from each element constituting the second data signal transmitter 30An. In the second data signal transmitter 30An, one terminal of the resistance element R31n is connected to the second transmitting-side node Nsn, and the other terminal of the resistance element R31n is connected to the collector of a second transmitting-side transistor Qsn. The first data signal transmitter 30Ap is supplied with the first data signal D1. Based on the logic level of the first data signal D1, the first transmitting-side transistor Qsp is turned on or off. Thus, the current flowing in the first transmission line L1 can be controlled in accordance with the logic level of the first data signal D1.

In the second data signal transmitter 30An, a resistance element R31n (a second transmitting-side resistance element) is provided between the second transmitting-side node Nsn and the second transmitting-side transistor Qsn. The second data signal transmitter 30An is supplied with the second data signal D2. When the logic level of the second data signal D2 is high, the second transmitting-side transistor Qsn is turned on. In this case, a current flows from the receiving apparatus 200 through the second transmission line L2, the second receiving-side node Nsn, and the resistance element R31n to the second transmitting-side transistor Qsn. On the other hand, when the logic level of the second data signal D2 is low, the second transmitting-side transistor Qsn is turned off. In this case, no current flows from the receiving apparatus 200 to the second data signal transmitter 30An.

In FIG. 7, a first data signal receiver 40Ap and a second data signal receiver 40An according to the receiving apparatus 200 are configured in the same manner as the data signal receiver 40A according to the first embodiment. In this figure, the digital processing circuit 60 and the amplifier 70 are omitted. A subscript "p" is appended to the code of each element constituting the first data signal receiver 40Ap. A subscript "n" is appended to the code of each element constituting the second data signal receiver 40An. As a result, each element constituting the first data signal receiver 40Ap can be distinguished from each element constituting the second data signal receiver 40An. In the second data signal receiver 40An, a resistance element R41n' (a third resistance element, a third receiving-side resistance element) is provided between the second receiving-side node Nrn and the base of a second receiving-side transistor Qrn. A resistance element 42n' (a fourth resistance element and a fourth receiving-side resistance element) is provided between the base of the second receiving-side transistor Qrn and the power supply node Nd.

In the first data signal receiver 40Ap, a first receiving-side transistor Qrp (a first transistor) amplifies the current flowing through the first transmission line L1, and a first data signal generator 41p generates the first data signal D1 based on the amplified current.

On the other hand, in the second data signal receiver 40An, the second receiving-side transistor Qrn (a second transistor) amplifies the current flowing through the second transmission line L2, and a second data signal generator 41n generates the second data signal D2 based on the amplified current.

In the signal transmitting system 1C, when the logic level of the first data signal D1 and the logic level of the second data signal D2 do not coincide with each other, a difference between the transmission characteristic of the first transmission line L1 and the transmission characteristic of the second transmission line L2 increases, and the CMRR decreases compared to the CMRR of the signal transmitting system 1B according to the second embodiment.

The signal transmitting system 1C can bring the transmission characteristic of the first transmission line L1 closer to that of the second transmission line L2 as compared to the signal transmitting system 1A according to the first embodiment. Thus, the CMRR of the signal transmitting system 1C can be improved as compared to the CMRR of the signal transmitting system 1A. The signal transmitting system 1C has an advantage in that the data signal can be transmitted by use of two lines.

As illustrated in FIG. 4, the frequency characteristic F3 of the CMRR in the third embodiment becomes lower than the frequency characteristic F2 of the CMRR in the second embodiment. However, compared to the frequency characteristic F1 of the CMRR of the first embodiment, there is an improvement of about 9 dB in a low band of 200 Hz or lower, and there is an improvement of about 18 dB in a high band of 1 kHz or higher.

4. Modifications

The present disclosure is not limited to the embodiments described above, and various modifications which will be described below are possible. Further, each of the modifications and the embodiments may be combined as appropriate.

(1) In the first embodiment described above, the data signal transmitter 30A and the data signal receiver 40A are connected to the first transmission line L1. However, the data signal transmitter 30A and the data signal receiver 40A may be connected to the second transmission line L2 instead of the first transmission line L1. That is, the data signal may be transmitted by use of either the first transmission line L1 or the second transmission line L2.

(2) In each of the embodiments described above, the NPN type of transistor is used as the transistor in the transmitting apparatus 100, and the PNP type of transistor is used as the transistor in the receiving apparatus 200. However, the present disclosure is not limited thereto, and the PNP type of transistor may be used as the transistor in the transmitting apparatus 100 and the NPN type of transistor may be used as the transistor in the receiving apparatus 200.

(3) Although a bipolar transistor is illustrated as an example of a transistor in each of the embodiments described above, the present disclosure is not limited thereto, and a unipolar transistor may also be used. For example, an N-channel field effect transistor may be used instead of the NPN-type bipolar transistor. Alternatively, a P-channel field effect transistor may be used instead of the PNP-type bipolar transistor.

(4) In each of the embodiments described above, an analog audio signal is used as an example of a transmission signal transmitted by use of the first transmission line L1 and the second transmission line L2, but the present disclosure is not limited thereto. The transmission signal may be, for example, a digital signal, an analog video signal, or a digital audio signal.

Figure 8:
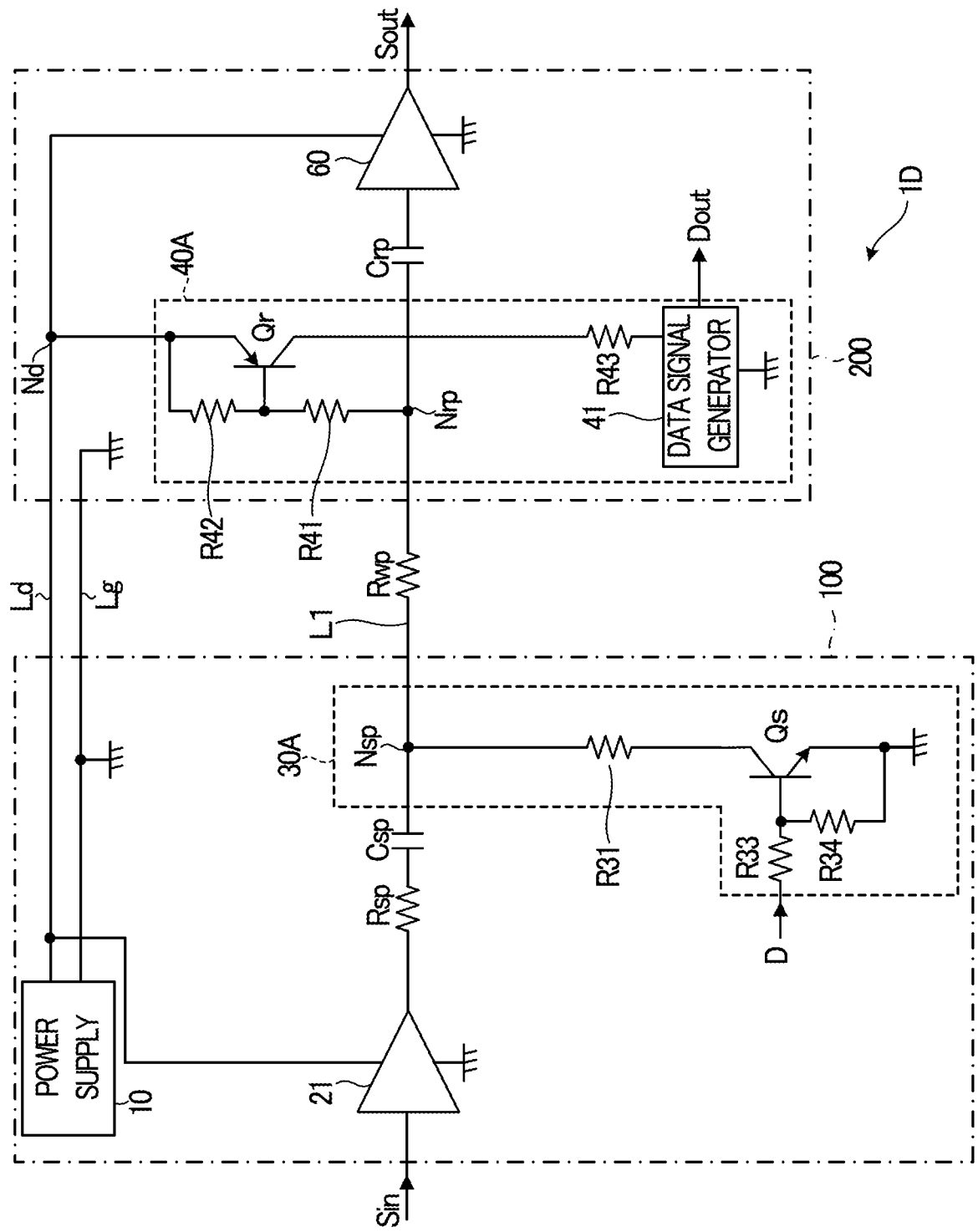
FIG. 8 is a circuit diagram illustrating a configuration of a signal transmitting system 1D according to a modified example.

(5) In each of the embodiments described above, the differential signal outputter 20 differentially transmits the input audio signal Vin by use of the first transmission line L1 and the second transmission line L2, but the present disclosure is not limited thereto. FIG. 8 shows a signal transmitting system 1D according to a modification. In FIG. 8, the same reference numerals denote the same components as those of the signal transmitting system 1A according to the first embodiment described with reference to FIG. 2.

The transmitting apparatus 100 in the signal transmitting system 1D is provided with a transmission signal S. The buffer 21 outputs the transmission signal S to the first transmission line L1 via the first transmitting-side capacitance element Csp. The data signal transmitter 30A is connected to the first transmitting-side node Nsp, and controls the current flowing through the first transmission line L1 in accordance with the logic level of the data signal D. In other words, the transmission signal S is transmitted by the first transmission line L1, and the current flowing through the first transmission line L1 is changed in accordance with the logic level of the data signal D. In the receiving apparatus 200, the receiving-side capacitance element Crp is connected to the first transmission line L1, and outputs the transmission signal Sout. In the data signal receiver 40A, the receiving-side transistor Qr amplifies the current flowing between the power supply node Nd and the receiving-side node Nrp. The data signal generator 41 generates the data signal D based on the current amplified by the receiving-side transistor Qr.

In the signal transmitting system 1D, the current flowing through the first transmission line L1 is amplified by the receiving-side transistor Qr. Therefore, the resistance values of the resistance elements R31, R41, and R42 can be increased. As a result, it is possible to increase a load on the buffer 21. A high-pass filter is formed of the first transmitting-side capacitance element Csp, the resistance element R31 (a transmitting-side resistance element, a first transmitting-side resistance element) and the resistance element R41. Thus, the cutoff frequency can be lowered. Although the AC potential difference Vg is multiplexed on the transmitting-side ground potential GND_S of the receiving apparatus 200, the AC potential difference Vg entering the first transmission line L1 can be reduced via the transmitting-side transistor Qs and the resistance element R31.

(6) In each of the embodiments described above, the data signal D, the first data signal D1, and the second data signal D2 represent a 2 value logic level. However, the data signal transmitters 30A, 30B, the first data signal transmitter 30Ap, and the second data signal transmitter 30An (hereafter referred to as a transmitter) may control a direct current that indicates 3 or more values. Thus, the transmitter may include a constant current source to output a direct current that corresponds to the data signal to be transmitted. The transmitter may be configured to include a DA converter that employs an R-2R type ladder resistor. The DA converter receives a voltage to output a direct current that indicates 3 or more values.

On the other hand, in the receiving apparatus 200, a receiver configured to receive the data signal includes a common resistance element, a first resistance element, a second resistance element and a current detector. The common resistance element is provided between the power supply node Nd and a common node. The first resistance element is provided between the common node and the first receiving-side node Nrp. The second resistance element is provided between the common node and the second receiving-side node Nm. The current detector detects a direct current flowing through the common node. The current detector may compare the magnitude of the direct current flowing through the common node with threshold values in order to generate data that indicates 3 or more values. In this case, the data signal D is transmitted by use of both the first transmission line L1 and the second transmission line L2, thus making it possible to transmit multi-valued data without lowering the CMRR in comparison with a configuration where the data signal D is transmitted by use of one only of the first transmission line L1 and the second transmission line L2.

(7) The signal transmitting systems 1A and 1B and 1C according to the embodiments described above, and the signal transmitting system 1D according to the modifications can be applied for use in an emergency notification system in a vehicle. The emergency notification system used in the vehicle communicates with a management center when an emergency occurs in the vehicle. The emergency notification system includes a communication apparatus and an audio processing apparatus. The communication apparatus transmits and receives audio signals representative of audio sound and data to and from a management center. The audio processing apparatus is connected to a microphone and a speaker.

The audio signal is transmitted from the communication apparatus (the transmitting apparatus described above) to the audio processing apparatus (the above-described receiving apparatus) by use of the first transmission line L1 and the second transmission line L2, such that the audio from the management center can be output from the speaker. When the communication apparatus detects a failure, the communication apparatus can transmit notification of the failure to the audio processing apparatus by transmission of the data signal.

Further, when a data signal transmitter is provided in the audio processing apparatus and a data signal receiver is provided in the communication apparatus, notification of the failure detected by the audio processing apparatus can be transmitted to the communication apparatus.

5. Aspect Understood from at Least One of the Embodiments and Modifications

The following aspects are understood in view of at least one of the embodiments and the modifications described above.

In one aspect, the receiving apparatus includes: a capacitance element connected to a receiving side of a transmission line through which a transmission signal is transmitted, and a direct current flowing through the transmission line changes in accordance with a logic level of a data signal; a transistor configured to amplify a current flowing between a receiving-side node and a power-supply node to which a power supply potential is supplied, where the receiving-side node is located between the transmission line and the capacitance element; and a data signal generator configured to generate the data signal based on the current amplified by the transistor.

In the transmitting apparatus, when the direct current flowing through the transmission line is changed in accordance with the logic level of the data signal, it is necessary for a direct current to flow between the transmission line and the ground of the transmitting apparatus. Accordingly, a current path exists through which a direct current flows between the transmission line and the ground of the transmitting apparatus. When there is an AC potential difference between the ground of the transmitting apparatus and the ground of the receiving apparatus, the AC potential difference resulting in noise is multiplexed on the transmission signal via the current path. As a result, the SN ratio of the transmission signal is reduced. A combined resistance is composed of the resistance of the current path in the transmitting apparatus and the resistance provided between the receiving-side node and the power supply node. Specifically, the resistance of the current path in the transmitting apparatus is connected to the resistance, which is provided between the receiving-side node and the power supply node, in parallel. The magnitude of the AC potential difference multiplexed on the transmission signal decreases in accordance with an increase in the resistance value of the combined resistance.

According to this aspect, the data signal is generated based on the current obtained by amplifying the current flowing between the receiving-side node and the power supply node by use of the transistor. Thus, an amount of current flowing through the transmission line to transmit the data signal can be reduced.

The resistance value between the receiving-side node and the power supply node and the resistance value of the current path in the transmitting apparatus can be made larger than those in the configuration in which the current flowing between the receiving-side node and the power supply node is not amplified by using the transistor. In this way, an impact of the AC potential difference on the transmission line can be reduced.

In one aspect of the receiving apparatus described above, the receiving apparatus may include a first resistance element provided between the receiving-side node and a control terminal of the transistor, and a second resistance element provided between the control terminal of the transistor and the power supply node.

According to this aspect, even if the resistance value of the first resistance element and the resistance value of the second resistance element are increased, the current flowing between the receiving-side node and the power supply node can be amplified by a transistor to generate a data signal. In addition, when a transmitting apparatus and a receiving apparatus are distant from each other, an AC potential difference may be generated between the ground potential of the transmitting apparatus and the ground potential of the receiving apparatus by a return current of a transmission signal that differs from the transmission signal and a return current from the digital circuit. The AC potential difference becomes a noise voltage, but by increasing the resistance values of the first resistance element and the second resistance element, it is possible to reduce entry of the noise voltage into the transmission signal.

In an aspect of the receiving apparatus described above, the transmission line is a first transmission line, and the capacitance element is a first capacitance element, the apparatus further includes: a second capacitance element connected to a receiving side of a second transmission line through which an inverted-phase signal is obtained by inverting the transmission signal; and a differential signal inputter configured to output a single-ended signal based on the transmission signal output from the first capacitance element and the inverted-phase signal output from the second capacitance element.

According to this aspect, the single-ended signal is generated based on the transmission signal and the inverted-phase signal, which are differentially transmitted. Thus, the SN ratio of the single-ended signal can be improved by removal of in-phase noise.

In an aspect of the receiving apparatus described above, a direct current flowing through the second transmission line changes in accordance with a logic level of the data signal. The receiving-side node is a first receiving-side node, and the apparatus further includes: a third resistance element provided between the control terminal of the transistor and a second receiving-side node positioned between the second transmission line and the second capacitance element.

According to this aspect, the data signal is transmitted by use of the first transmission line and the second transmission line. Therefore, the resistance value of the first resistance element and the resistance value of the third resistance element can be increased. In addition, the first transmission line and the second transmission line can be balanced with each other. Thus, the transmission characteristic of the first transmission line can be brought close to the transmission characteristic of the second transmission line. As a result, the CMRR can be improved.

In an aspect of the receiving apparatus described above, the receiving-side node is a first receiving-side node, the data signal is a first data signal, the data signal generator is a first data signal generator, the transistor is a first transistor, and the apparatus further includes: a second transistor configured to amplify a current flowing between a second receiving-side node and the power supply node, where the second receiving-side node is positioned between the second transmission line and the second capacitance element; a direct current flowing through the second transmission line changes in accordance with a logic level of the data signal, a fourth resistance element provided between the second receiving-side node and the control terminal of the second transistor; a fifth resistance element provided between the control terminal of the second transistor and the power supply node; and a second data signal generator configured to generate the second data signal based on the current amplified by the second transistor.

According to this aspect, the first data signal is received via the first transmission line, and the second data signal is received via the second transmission line. Therefore, the data signals of the two lines can be received while receiving the transmission signal in differential format.

Next, an aspect of the signal transmitting system includes: a transmitting apparatus that includes: an outputter configured to output a transmission signal to a transmission line via a transmitting-side capacitance element; and a transmitting-side transistor configured to control a direct current flowing through the transmission line in accordance with a logic level of a data signal, a receiving apparatus that includes: a receiving-side capacitance element connected to a receiving side of the transmission line; a receiving-side transistor configured to amplify a current flowing between a receiving-side node and a power supply node to which a power supply potential is supplied, where the receiving-side node is positioned between the transmission line and the receiving-side capacitance element; and a data signal generator configured to generate the data signal based on the current amplified by the receiving-side transistor.

According to this aspect, the direct current flowing to the transmission line is controlled by use of the transmitting-side transistor, and the data signal is generated based on the current obtained by amplifying the current flowing between the receiving-side node and the power supply node. Accordingly, it is possible to reduce the current flowing through the transmission line for transmission of the data signal. Thus, the resistance value of the current path in the transmitting apparatus and the resistance value of a path between the receiving-side node and the power supply node can be made larger than those in a configuration where the current is not amplified by use of the transistor. Consequently, an impact of the AC potential difference, which occurs between the ground of the transmitting apparatus and the ground of the receiving apparatus, on the transmission line can be reduced.

In one aspect of the signal transmitting system described above, the transmitting-side transistor is controlled to be in an ON state or an OFF state in accordance with the logic level of the data signal, and the transmitting apparatus further comprises a transmitting-side resistance element provided between a transmitting-side node and the transmitting-side transistor, where the transmitting-side node is positioned between the transmitting-side capacitance element and the transmitting line, and the receiving apparatus further includes: a first receiving-side resistance element provided between the receiving-side node and a control terminal of the receiving-side transistor, and a second receiving-side resistance element provided between the control terminal of the receiving-side transistor and the power supply node.

According to this aspect, a current flows through the transmitting-side resistance element, the first receiving-side resistance element, a second receiving-side resistance element, and transmission line. Since the current is amplified by using the receiving-side transistor, it is possible to increase resistance values of the transmitting-side resistance element, the first receiving-side resistance element, and the second receiving-side resistance element. As a result, a cutoff frequency of the high-pass filter including the transmitting-side capacitance element, the transmitting-side resistance element, and the first receiving-side resistance element can be reduced. Further, it is possible to reduce entry of noise voltage into the transmission line.

According to an aspect of the above-described signal transmitting system, the transmission line is a first transmission line, the transmitting-side capacitance element is a first transmitting-side capacitance element, the receiving-side capacitance element is a first receiving-side capacitance element, the outputter is a differential signal outputter configured to output the transmission signal toward the first transmission line via the first transmitting-side capacitance element and to output an inverted-phase signal obtained by inverting the transmission signal via the second transmitting-side capacitance element toward the second transmission line, and the receiving apparatus further includes: a second receiving-side capacitance element connected to a receiving side of the second transmission line; and a differential signal inputter configured to output a single-ended signal based on the transmission signal output from the first receiving-side capacitance element and the inverted-phase signal output from the second receiving-side capacitance element.

According to this aspect, the signal can be differentially transmitted. Thus, the signal is generated based on the transmission signal and the inverted-phase signal, which are differentially transmitted. Consequently, the SN ratio of the signal can be improved by removing in-phase noise.

In one aspect of the signal transmitting system described above, the receiving-side node is a first receiving-side node, the transmitting-side resistance element is a first transmitting-side resistance element, the transmitting apparatus further includes a second transmitting-side resistance element provided between a second transmitting-side node and the transmitting-side transistor, where the second transmitting-side node is located between the second transmitting-side capacitance element and the second transmission line, and the receiving apparatus further includes: a third receiving-side resistance element provided between a second receiving-side node and a control terminal of the receiving-side transistor, where the second receiving-side node is positioned between the second transmission line and the second receiving-side capacitance element.

According to this aspect, the data signal can be transmitted by use of the first transmission line and the second transmission line. Further, the transmitting-side transistor simultaneously controls currents flowing through the first transmission line and flowing through the second transmission line, thereby enabling use of a simplified configuration. The same applies to the receiving-side transistor. When the receiving-side transistor is provided for each of the first transmission line and the second transmission line, if there is a difference in the voltage Vbe between the base and the emitter of each receiving-side transistor, the CMRR may be lowered. However, since the first transmission line and the second transmission line share a common receiving-side transistor, no such disadvantage occurs.

An aspect of the signal transmitting system described above, the receiving-side node is a first receiving-side node, the data signal is a first data signal, the data signal generator is a first data signal generator, the transmitting-side transistor is a first transmitting-side transistor, the receiving-side transistor is a first receiving-side transistor, the transmitting apparatus further includes a second transmitting-side transistor controlled to be in an ON state or an OFF state in accordance with a logic level of a second data signal; and a second transmitting-side resistance element provided between a second transmitting-side node and the second transmitting-side transistor, where the second transmitting-side node is positioned between the second transmitting-side capacitance element and the second transmission line, and the receiving apparatus further includes: a second receiving-side transistor configured to amplify a current flowing between a second receiving-side node and the power supply node, where the second receiving-side node is positioned between the second transmission line and the second receiving-side capacitance element; a fourth receiving-side resistance element provided between the second receiving-side node and a control terminal of the second receiving-side transistor; a fifth receiving-side resistance element provided between the control terminal of the second receiving-side transistor and the power supply node; and a second data signal generator configured to generate the second data signal based on the current amplified by the second receiving-side transistor.

According to this aspect, the first data signal is transmitted by use of the first transmission line, and the second data signal is transmitted by use of the second transmission line. Thus, the data signals of the two lines can be transmitted while receiving the transmission signal in differential format.

DESCRIPTION OF REFERENCE SIGNS 1A, 1B, 1C, 1D: Signal transmitting system, 3: Speaker, 10: Power supply, 20: Differential signal outputter, 30A, 30B: Data signal transmitter, 30Ap: First data signal transmitter, 30An: Second data signal transmitter, 40A, 40B: Data signal receiver, 40Ap: First data signal receiver, 40An: Second data signal receiver, 50: Differential signal inputter, 100: Transmitting apparatus, 200: Receiving apparatus, Crp: First receiving-side capacitance element, Crn: Second receiving-side capacitance element, Csp: First transmitting-side capacitance element, Csn: Second transmitting-side capacitance element

What is claimed is:

1. A receiving apparatus comprising:
   a capacitance element connected to a receiving side of a transmission line configured to transmit a transmission signal, a direct current that flows through the transmission line being changed in accordance with a logic level of a data signal;
   a transistor configured to amplify a current that flows between a receiving-side node and a power supply node configured to be supplied with a power supply potential, the receiving-side node being positioned between the transmission line and the capacitance element;
   a data signal generator configured to generate the data signal based on the current amplified by the transistor;
   a first resistance element positioned between the receiving-side node and a control terminal of the transistor; and
   a second resistance element positioned between the control terminal of the transistor and the power supply node.

2. The receiving apparatus according to claim 1, wherein the transmission line is a first transmission line, and the capacitance element is a first capacitance element, the apparatus further comprising:
a second capacitance element connected to a receiving side of a second transmission line configured to transmit an inverted-phase signal, which is obtained by inverting the transmission signal; and
a differential signal inputter configured to output a signal based on the transmission signal output from the first capacitance element and the inverted-phase signal output from the second capacitance element.

3. The receiving apparatus according to claim 2, wherein
a direct current that flows through the second transmission line is changed in accordance with the logic level of the data signal, and
the receiving-side node is a first receiving-side node,
the apparatus further comprising:
a third resistance element positioned between the control terminal of the transistor and a second receiving-side node, the second receiving-side node being positioned between the second transmission line and the second capacitance element.

4. The receiving apparatus according to claim 2, wherein
the receiving-side node is a first receiving-side node,
the data signal is a first data signal,
the data signal generator is a first data signal generator,
the transistor is a first transistor, and
a direct current that flows through the second transmission line is changed in accordance with the logic level of the data signal,
the apparatus further comprising:
a second transistor configured to amplify a current that flows between a second receiving-side node and the power supply node, the second receiving-side node being positioned between the second transmission line and the second capacitance element;
a fourth resistance element positioned between the second receiving-side node and a control terminal of the second transistor;
a fifth resistance element positioned between the control terminal of the second transistor and the power supply node; and
a second data signal generator configured to generate the second data signal based on the current amplified by the second transistor.

5. A signal transmitting system comprising:
a transmitting apparatus comprising:
an outputter configured to output a transmission signal to a transmission line via a transmitting-side capacitance element; and
a transmitting-side transistor configured to control a direct current that flows through the transmission line in accordance with a logic level of a data signal;
a receiving apparatus comprising:
a receiving-side capacitance element connected to a receiving side of the transmission line;
a receiving-side transistor configured to amplify a current that flows between a receiving-side node and a power supply node configured to be supplied with a power supply potential, the receiving-side node being positioned between the transmission line and the receiving-side capacitance element; and
a data signal generator configured to generate the data signal based on the current amplified by the receiving-side transistor.

6. The signal transmitting system according to claim 5, wherein the transmitting-side transistor is configured to be in an ON state or an OFF state in accordance with the logic level of the data signal,
the transmitting apparatus further comprising:
a transmitting-side resistance element positioned between a transmitting-side node and the transmitting-side transistor, the transmitting-side node being positioned between the transmitting-side capacitance element and the transmission line, and
the receiving apparatus further comprising:
a first receiving-side resistance element positioned between the receiving-side node and a control terminal of the receiving-side transistor, and
a second receiving-side resistance element positioned between the control terminal of the receiving-side transistor and the power supply node.

7. The signal transmitting system according to claim 6, wherein
the transmission line is a first transmission line,
the transmitting-side capacitance element is a first transmitting-side capacitance element,
the receiving-side capacitance element is a first receiving-side capacitance element,
the outputter is a differential signal outputter configured to output the transmission signal toward the first transmission line via the first transmitting-side capacitance element and to output an inverted-phase signal, which is obtained by inverting the transmission signal, via the second transmitting-side capacitance element toward the second transmission line, and
the receiving apparatus further comprising:
a second receiving-side capacitance element connected to a receiving side of the second transmission line; and
a differential signal inputter configured to output a signal based on the transmission signal output from the first receiving-side capacitance element and the inverted-phase signal output from the second receiving-side capacitance element.

8. The signal transmitting system according to claim 7, wherein
the receiving-side node is a first receiving-side node,
the transmitting-side node is a first transmitting-side node,
the transmitting-side resistance element is a first transmitting-side resistance element,
the transmitting apparatus further comprising:
a second transmitting-side resistance element positioned between a second transmitting-side node and the transmitting-side transistor, the second transmitting-side node being positioned between the second transmitting-side capacitance element and the second transmission line, and
the receiving apparatus further comprising:
a third receiving-side resistance element positioned between a second receiving-side node and the control terminal of the receiving-side transistor, the second receiving-side node being positioned between the second transmission line and the second receiving-side capacitance element.

9. The signal transmitting system according to claim 7, wherein
the receiving-side node is a first receiving-side node,
the data signal is a first data signal,
the data signal generator is a first data signal generator,
the transmitting-side node is a first transmitting-side node,
the transmitting-side transistor is a first transmitting-side transistor, the receiving-side transistor is a first receiving-side transistor, the transmitting apparatus further comprising:

a second transmitting-side transistor configured to be in an ON state or an OFF state in accordance with a logic level of a second data signal; and a second transmitting-side resistance element positioned between a second transmitting-side node and the second transmitting-side transistor, the second transmitting-side node being positioned between the second transmitting-side capacitance element and the second transmission line, and the receiving apparatus further comprising:

a second receiving-side transistor configured to amplify a current that flows between a second receiving-side node and the power supply node, the second receiving-side node being positioned between the second transmission line and the second receiving-side capacitance element;

a fourth receiving-side resistance element positioned between the second receiving-side node and a control terminal of the second receiving-side transistor;

a fifth receiving-side resistance element positioned between the control terminal of the second receiving-side transistor and the power supply node; and a second data signal generator configured to generate the second data signal based on the current amplified by the second receiving-side transistor.

\* \* \* \* \*